United States Patent
Toh et al.

(10) Patent No.: US 9,034,711 B2
(45) Date of Patent: May 19, 2015

(54) LDMOS WITH TWO GATE STACKS HAVING DIFFERENT WORK FUNCTIONS FOR IMPROVED BREAKDOWN VOLTAGE

(75) Inventors: Eng Huat Toh, Singapore (SG); Jae Gon Lee, Daegu (KR); Chung Foong Tan, Yishun Sapphire (SG); Elgin Quek, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 212 days.

(21) Appl. No.: 13/046,332

(22) Filed: Mar. 11, 2011

(65) Prior Publication Data

US 2012/0228705 A1    Sep. 13, 2012

(51) Int. Cl.
| | |
|---|---|
| *H01L 21/336* | (2006.01) |
| *H01L 29/78* | (2006.01) |
| *H01L 29/423* | (2006.01) |
| *H01L 29/51* | (2006.01) |
| *H01L 29/49* | (2006.01) |
| *H01L 29/66* | (2006.01) |

(52) U.S. Cl.
CPC ...... *H01L 29/7816* (2013.01); *H01L 29/42368* (2013.01); *H01L 29/495* (2013.01); *H01L 29/512* (2013.01); *H01L 29/513* (2013.01); *H01L 29/517* (2013.01); *H01L 29/518* (2013.01); *H01L 29/66545* (2013.01); *H01L 29/66681* (2013.01)

(58) Field of Classification Search
CPC .................. H01L 29/42368; H01L 29/66681
USPC ........................ 257/E21.417; 438/286, 287
See application file for complete search history.

(56) References Cited

U.S. PATENT DOCUMENTS

| | | | | |
|---|---|---|---|---|
| 5,648,284 | A * | 7/1997 | Kusunoki et al. | 438/286 |
| 8,748,271 | B2 * | 6/2014 | Toh et al. | 438/283 |
| 2001/0017390 | A1 * | 8/2001 | Long et al. | 257/368 |
| 2004/0201071 | A1 | 10/2004 | Dosluoglu et al. | |
| 2009/0176338 | A1 | 7/2009 | Wang et al. | |
| 2010/0112764 | A1 | 5/2010 | Mehrotra et al. | |
| 2011/0079846 | A1 * | 4/2011 | Yao et al. | 257/335 |
| 2011/0163376 | A1 | 7/2011 | Cheng et al. | |
| 2011/0171820 | A1 * | 7/2011 | Tsau et al. | 438/592 |
| 2011/0193161 | A1 | 8/2011 | Zhu et al. | |

OTHER PUBLICATIONS

Office Action for related U.S. Appl. No. 13/046,313 dated Jan. 14, 2013, pp. 1-14.

(Continued)

*Primary Examiner* — Howard Weiss
(74) *Attorney, Agent, or Firm* — Ditthavong & Steiner, P.C.

(57) ABSTRACT

An LDMOS is formed with a second gate stack over the n⁻ drift region, having a common gate electrode with the gate stack, and having a higher work function than the gate stack. Embodiments include forming a first conductivity type well, having a source, surrounded by a second conductivity type well, having a drain, in a substrate, forming first and second gate stacks on the substrate over a portion of the first well and a portion of the second well, respectively, the first and second gate stacks sharing a common gate electrode, and tuning the work functions of the first and second gate stacks to obtain a higher work function for the second gate stack. Other embodiments include forming the first gate stack with a first high-k dielectric and the second gate stack with a second high-k dielectric, and forming the first and second gate stacks with asymmetric dielectrics.

12 Claims, 7 Drawing Sheets

(56) References Cited

OTHER PUBLICATIONS

Cortes et al., "Optimisation of low voltage Field Plate LDMOS transistors", Proceedings of the 2009 Spanish Conference on Electron Devices—Feb. 2009, pp. 475-478.

Efland et al., "Lateral Thinking About Power Devices (LDMOS)", IEEE, 1998, pp. 26.1.1-26.1.4.

Jung et al., Integration Friendly Dual Metal Gate Technology Using Dual Thickness Metal Inserted Poly-Si Stacks (DT-MIPS), 2007 Symposium on VLSI Technology Digest of Technical Papers, pp. 196-197.

Ludikhuize, Adriaan W., "A Review of RESURF Technology", ISPSO, May 2000, pp. 11-18.

Marbell et al., "Effects of Dummy Gate on Breakdown and Degradation of LDMOSFETs", IEEE Transactions on Devices and Materials Reliability, vol. 8, No. 1, Mar. 2008, pp. 193-202.

Schram et al., "Novel Process to Pattern Selectively Dual Dielectric Capping Layers Using Soft-Mask Only", 2008 Symposium on VLSI Technology Digest of Technical Papers, pp. 44-45.

Shibib et al., "Control of Hot Carrier Degradation in LDMOS Devices by a Dummy Gate Field Plate: Experimental Demonstration", Proceedings of 2004 International Symposium on Power Semiconductor Devices & ICs, pp. 233-235.

Shrivastava et al., "Part I: Mixed-Signal Performance of Various High-Voltage Drain-Extended MOS Devices", IEEE Transactions on Electron Devices, vol. 57, No. 2, Feb. 2010, pp. 448-457.

Shrivastava et al., "Part II: A Novel Scheme to Optimize the Mixed-Signal Performance and Hot-carrier Reliability of Drain-Extended MOS Devices", IEEE Transactions on Electron Devices, vol. 57, No. 2, Feb. 2010, pp. 458-465.

Wu et al., "30-W/mm GaN HEMTs by Field Plate Optimization", IEEE Electron Device Letters, vol. 25, No. 3, Mar. 2004, pp. 117-119.

Yuan et al., "A Novel Split-Gate MOSFET Design Realized by a Fully Silicided Gate Process for the Improvement of Transconductance and Output Resistance", IEEE Electron Device Letters, vol. 26, No. 11, Nov. 2005, pp. 829-831.

Office Action for related U.S. Appl. No. 13/046,313 dated Jun. 27, 2012, pp. 1-21.

* cited by examiner

LDMOS WITH TWO GATE STACKS HAVING DIFFERENT WORK FUNCTIONS FOR IMPROVED BREAKDOWN VOLTAGE

TECHNICAL FIELD

The present disclosure relates to embedded high voltage transistors with a high breakdown voltage. The present disclosure is particularly applicable to lateral diffused MOS (LDMOS) transistors.

BACKGROUND

Embedded high voltage (HV) transistors are gaining importance as the need for both high voltage transistors and low voltage transistors to co-exist on the same chip rises. Applications of embedded HV transistors include automobiles, displays electronics, telecommunications, and power converters. One of the common architectures used for HV devices is the lateral diffused MOS (LDMOS) transistor, such as that illustrated in FIG. 1. As shown, shallow trench isolation (STI) regions 101 are formed in an n$^-$ region 103 on p-substrate 105. Typically, n$^-$ region 103 is formed epitaxially or by well implant. Gate 107 and gate dielectric 109 are formed on a p$^-$ doped buried body 111 in n$^-$ region 103 between two STI regions 101. Source (n$^+$) 113 and p$^+$ region 115 are formed in buried body 111 adjacent one STI region 101, and drain (n$^+$) 117 is formed in n$^-$ region 103 adjacent another STI region 101. An inter layer dielectric (ILD) 119 is formed over the entire device. The LDMOS transistor can operate over a wide range of breakdown voltages (from 6 volt (V) to greater than 50 V). The main challenges for HV transistors are the breakdown voltage ($V_{br}$) and the parasitic resistance in the on-state ($R_{dson}$), which are inversely related. The n$^-$ region 103, or n$^-$ drift region, of the LDMOS is employed to increase $V_{br}$ by sustaining a larger depletion width/voltage drop. The drawback of the n$^-$ region is the higher $R_{dson}$ (the sum of the resistances of the source ($R_s$), the channel ($R_{ch}$), the drift ($R_{drift}$), and the drain ($R_d$)) due to a lower doped drain.

To increase the breakdown voltage of the LDMOS, a field plate 201 or 203 has been added as illustrated in FIGS. 2A and 2B, respectively. The field plate, i.e. the extended gate 201 or extra gate 203, sits on a thicker oxide above the n$^-$ epi region 103 and could be shorted to the gate/source, floated, grounded or independently biased. The field plate helps widen the depletion width/reduce the peak electric field at the surface of the n$^-$ drift region, which in turn allows the device to sustain a larger voltage before breakdown occurs. Adverting to FIGS. 3 through 5, FIG. 3 schematically illustrates the depletion width near the gate edge for the LDMOS of FIG. 1, without a field plate. FIGS. 4 and 5 respectively show schematics of the energy band diagram extracted vertically from the field plate to the drain and the depletion width near the gate edge for the LDMOS of FIG. 2B, with a field plate. As illustrated, the depletion width increases with a field plate, the electric field is reduced, and the LDMOS has a higher $V_{br}$. Alternatively, for a fixed blocking voltage, the n-epi concentration or the lateral extended drain (drift region) concentration may be increased, thereby reducing $R_{dson}$.

A need therefore exists for LDMOS devices exhibiting a high $V_{br}$ while maintaining a low $R_{sdon}$, and for enabling methodology.

SUMMARY

An aspect of the present disclosure is a method of fabricating an LDMOS by forming a second gate stack over the n$^-$ drift region, having a common gate electrode with the gate stack, and having a higher work function than the gate stack.

Another aspect of the present disclosure is an LDMOS with a second gate stack over the n$^-$ drift region, having a common gate electrode with the gate stack, and having a higher work function than the gate stack.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a first well and a second well in a substrate, the second well surrounding the first well; doping the first well with a first-type dopant and the second well with a second-type dopant; forming a source in the first well and a drain in the second well; forming a doped region of the first-type dopant in the first well, the doped region functioning as a body contact to the first well; forming a first gate stack on a portion of the first well; forming a second gate stack on a portion of the second well; wherein the first and second gate stacks have a common gate electrode, and the second gate stack has a higher work function than the first gate stack.

Aspects of the present disclosure include forming the first and second gate stacks by: forming an oxide layer on the portion of the second well; forming a high-k dielectric layer on the portion of the first well and on the oxide layer; and forming a common metal gate electrode on the high-k dielectric layer. Further aspects include forming the first and second gate stacks by: forming an oxide layer on the portion of the first well and on the portion of the second well; forming a dummy gate electrode on the oxide layer; forming an interlayer dielectric over the entire substrate; removing the dummy gate electrode, forming a cavity; removing the oxide layer (or part of the oxide) on the portion of the first well, leaving the oxide layer on the portion of the second well; forming the high-k dielectric layer on the oxide layer and on either the portion of the first well or on a thin oxide over the portion of the first well; and forming the common metal gate electrode on the high-k dielectric layer.

Other aspects include forming the first and second gate stacks by: forming a first high-k dielectric layer or an oxide layer followed by a first high-k dielectric layer on the portion of the first well; forming a second high-k dielectric layer or an oxide layer followed by a second high-k dielectric layer on the portion of the second well; and forming a common gate electrode on both the first and second high-k dielectric layers. (The high-k layer may include a work function tuning layer, just before the metal gate deposition.) Additional aspects include forming the first and second gate stacks by: forming a dielectric layer on the portion of the first well and on the portion of the second well; implanting a first dopant in the dielectric layer on the portion of the first well; and implanting a second dopant, different from the first dopant, in the dielectric layer on the portion of the second well; and forming a common gate electrode on the dielectric layer. Further aspects include forming the first and second gate stacks by: forming a dielectric layer on the portion of the first well and on the portion of the second well; depositing a work function adjustment material on the dielectric layer on the portion of the first well or the portion of the second well; and forming a common gate electrode on the dielectric layer.

Another aspect includes forming the first and second gate stacks by: forming a dummy gate stack on the substrate over the portions of the first well and the second well; forming an interlayer dielectric (ILD) over the entire substrate; removing the dummy gate stack, forming a cavity; forming a first dielectric layer or an oxide layer and a first dielectric layer in the cavity on the portion of the first well; forming a second dielectric layer or an oxide layer and a second dielectric layer in the cavity on the portion of the second well; and forming a common metal gate electrode on the first and second dielectric layers. Additional aspects include forming the first and second gate stacks by: forming a dummy gate stack on the substrate over the portions of the first well and the second well; forming an interlayer dielectric (ILD) over the entire substrate; removing the dummy gate stack, forming a cavity; forming a dielectric layer in the cavity; implanting a first dopant in the dielectric layer on the portion of the first well; implanting a second dopant, different from the first dopant, in the dielectric layer on the portion of the second well; and forming a common metal gate on the dielectric layer. Other aspects include forming the first and second gate stacks by: forming a dummy gate stack on the substrate over the portions of the first well and the second well; forming an interlayer dielectric (ILD) over the entire substrate; removing the dummy gate stack, forming a cavity; forming a dielectric layer or an oxide layer and a dielectric layer in the cavity; depositing a work function adjustment material on the dielectric layer on the portion of the first well or the portion of the second well; and forming a common metal gate on the dielectric layer and on the work function adjustment material.

Another aspect of the present disclosure is a device including: a substrate; a first well and a second well in the substrate, the first well being doped with a first conductivity type dopant, the second well being doped with a second conductivity type dopant, and the second well surrounding the first well; a source in the first well and a drain in the second well; a doped region of the first conductivity type dopant in the first well, the doped region functioning as a body contact to the first well; a first gate stack on a portion of the first well; a second gate stack on a portion of the second well, the first and second gate stacks having a common gate electrode; wherein the work function of the second gate stack is higher than the work function of the second gate stack.

Aspects include devices with first and second gate stacks having: an oxide layer on the portion of the second well; a high-k dielectric layer on the portion of the first well and on the oxide layer; and a common metal gate electrode on the high-k dielectric layer. Other aspects include devices with first and second gate stacks having: a first high-k dielectric layer on the portion of the first well; a second high-k dielectric layer on the portion of the second well; and a common gate electrode on both the first and second high-k dielectric layers. (A common oxide layer may precede both high-k dielectric layers.) Further aspects include devices with first and second gate stacks having: a dielectric layer on the portion of the first well and on the portion of the second well; a first dopant implanted in the dielectric layer on the portion of the first well; and a second dopant, different from the first dopant, implanted in the dielectric layer on the portion of the second well; and a common gate electrode on the dielectric layer. Additional aspects include devices with first and second gate stacks having: a dielectric layer on the portion of the first well and on the portion of the second well; a work function adjustment material deposited on the dielectric layer on the portion of the first well or the portion of the second well; and a common gate electrode on the dielectric layer.

Another aspect includes devices comprising an interlayer dielectric (ILD) over the entire substrate, with a cavity formed over the portion of the first well and the portion of the second well; a first dielectric layer in the cavity on the portion of the first well; a second dielectric layer in the cavity on the portion of the second well; and a common metal gate electrode on the first and second dielectric layers. Further aspects include devices comprising an interlayer dielectric (ILD) over the entire substrate, with a cavity formed over the portion of the first well and the portion of the second well; a dielectric layer in the cavity on the portion of the first well and the portion of the second well; a first dopant implanted in the dielectric layer on the portion of the first well; a second dopant, different from the first dopant, implanted in the dielectric layer on the portion of the second well; and a common metal gate on the dielectric layer. Other aspects include devices comprising an interlayer dielectric (ILD) over the entire substrate, having a cavity formed over the portion of the first well and the portion of the second well; a dielectric layer in the cavity; a work function adjustment material deposited on the dielectric layer on the portion of the first well or the portion of the second well; and a common metal gate on the dielectric layer and on the work function adjustment material.

Another aspect of the present disclosure is a method including: forming a lateral diffused MOS (LDMOS) by: forming a first well and a second well in a substrate, the second well surrounding the first well; doping the first well with a p-type dopant and the second well with an n-type dopant; forming a source in the first well and a drain in the second well; and forming a p-doped region in the first well, the p-doped region functioning as a body contact to the first well; forming a first gate stack on the substrate over a portion of the first well; forming a second gate stack on the substrate over a portion of the second well, the first and second gate stacks having a common gate electrode, and the second gate stack having a higher work function than the first gate stack, wherein the first and second gate stacks include different gate dielectric layers or asymmetrical dielectric layers. Additional aspects include forming different gate dielectric layers by different dielectric materials on the portions of the first and second wells, respectively, or by forming a common dielectric layer on the portions of the first and second wells and implanting different dopants in the dielectric layer on the portions of the first well and the second well, respectively. Other aspects include forming asymmetrical dielectric layers by: forming an oxide layer on the portion of the second well; and forming a dielectric layer on the portion of the first well and on the oxide layer.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves problems of low breakdown voltage and high parasitic resistance attendant upon forming an LDMOS transistor. In accordance with embodiments of the present disclosure, two gate stacks with a common electrode are formed. The first gate stack, a high-k metal gate stack, is employed for channel control. The second gate stack is formed with a different high-k dielectric having a higher work function, to increase the breakdown voltage while maintaining a low parasitic resistance.

Methodology in accordance with embodiments of the present disclosure includes forming a first well and a second well in a substrate, the second well surrounding the first well, doping the first well with a first-type dopant and the second well with a second-type dopant, forming a source in the first well and a drain in the second well, forming a doped region of the first-type dopant in the first well, the doped region functioning as a body contact to the first well, forming a first gate stack on a portion of the first well, forming a second gate stack on a portion of the second well, wherein the first and second gate stacks have a common gate electrode, and the second gate stack has a higher work function than the first gate stack.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

FIGS. 6A through 6G schematically illustrate a process flow for forming an LDMOS having a tied metal gate on an asymmetric dielectric, in accordance with an exemplary embodiment. Adverting to FIG. 6A, $n^-$ Epi region (or $n^-$ well) 601 and $p^-$ well 603 are formed between STI regions 605 on a p-type substrate 607 by conventional methods.

Figure 1:
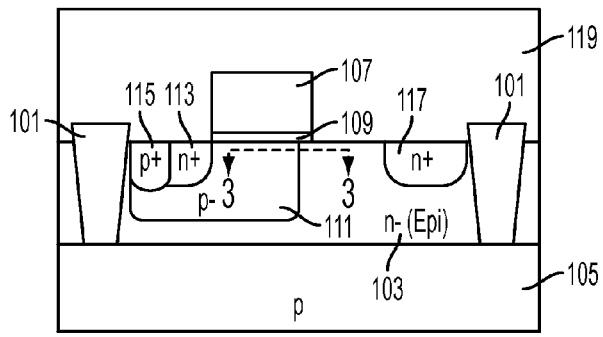
FIG. 1 schematically illustrates a prior art LDMOS.
Figure 2A:
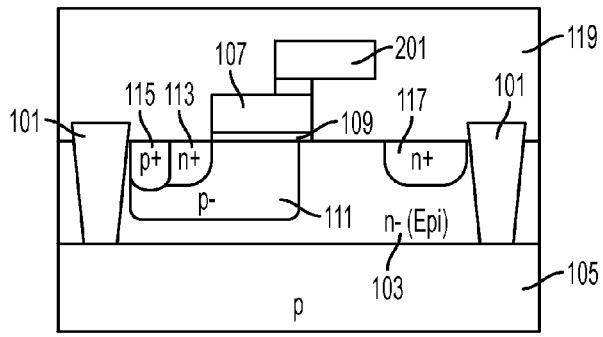
FIGS. 2A and 2B schematically illustrate an a prior art LDMOS with a field plate.
Figure 2B:
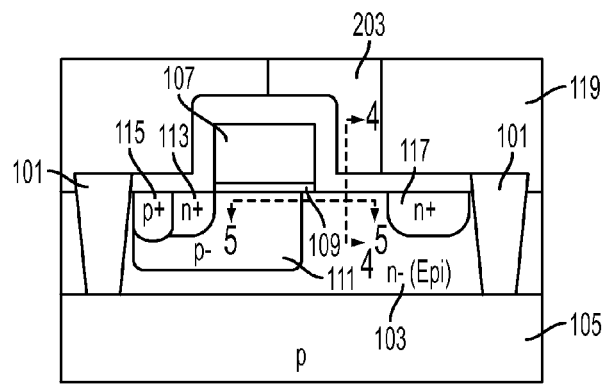
Figure 3:
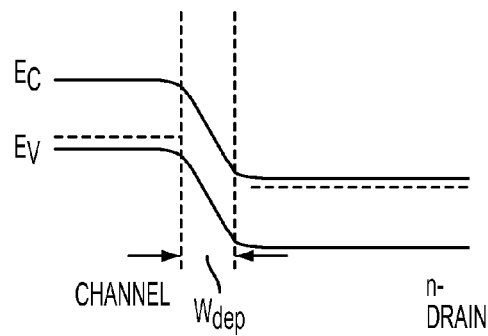
FIG. 3 schematically illustrates the depletion width of the LDMOS of FIG. 1.
Figure 4:
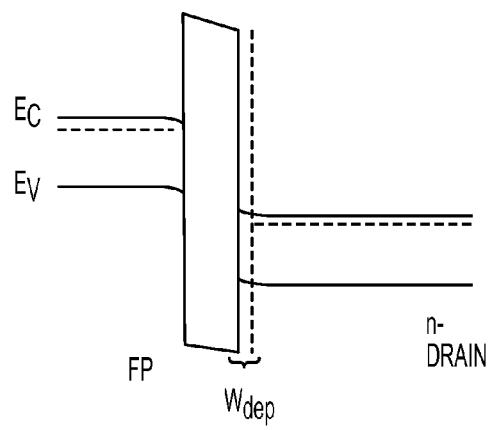
FIG. 4 schematically illustrates the energy band of the LDMOS of FIG. 2B.
Figure 5:
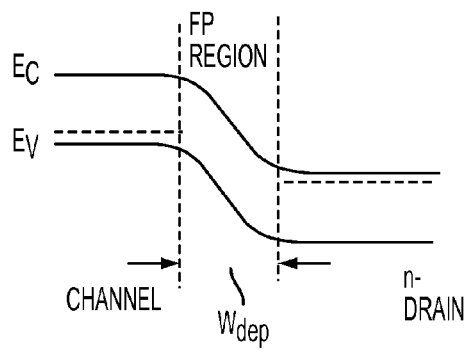
FIG. 5 schematically illustrates the depletion width of the LDMOS of FIG. 2B.
Figure 6A:
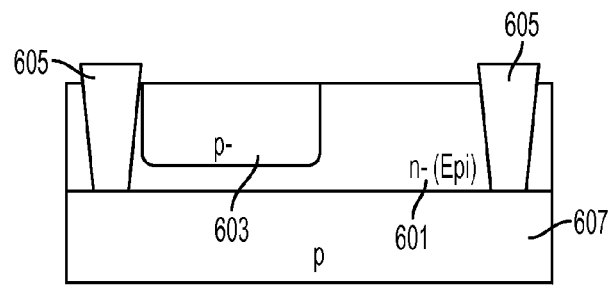
FIGS. 6A through 6G schematically illustrate a process flow for forming an LDMOS having a tied metal gate on an asymmetric dielectric.
Figure 6B:
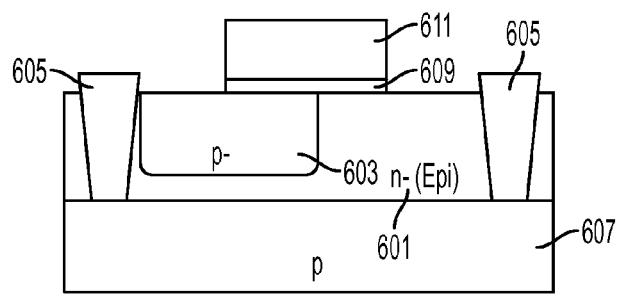

As illustrated in FIG. 6B, gate oxide 609 is formed to a thickness of 10 Å to 300 Å on a portion of $p^-$ well 603 and a portion of $n^-$ Epi region 601. Dummy gate 611 is formed to a thickness of 200 Å to 2000 Å on gate oxide 609. Dummy gate 611 may be formed to a width of 300 nm, 50 nm of which may be over $n^-$ Epi region 601.

Figure 6C:
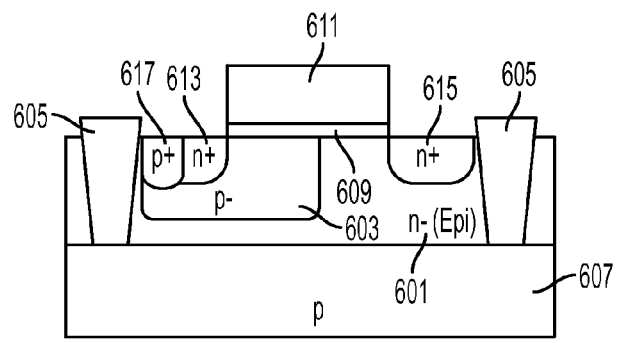

A lightly doped drain (LDD) may optionally be formed followed by spacer formation (not shown for illustrative convenience). Source 613 and drain 615 may then be formed in p-well 603 and n-well 601, respectively, as illustrated in FIG. 6C. In addition, $p^+$ body 617 may be formed in p-well 603, which functions as a body contact to the p-well. Rapid thermal anneal (RTA) and source/drain silicidation may be performed by conventional methods.

Figure 6D:
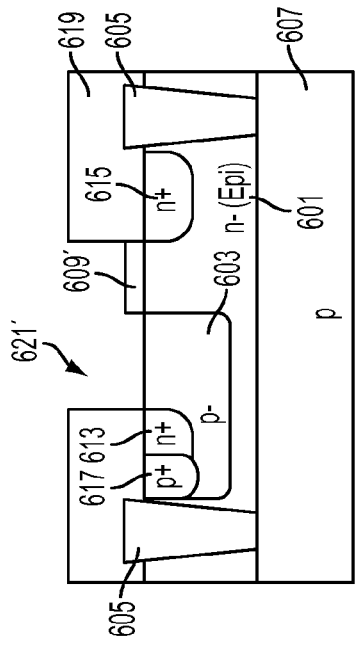

Adverting to FIG. 6D, an ILD 619, for example $SiO_2$, is formed over the entire substrate, including dummy gate 611. Chemical mechanical polishing (CMP) is performed to expose the top surface of dummy gate 611.

Figure 6F:
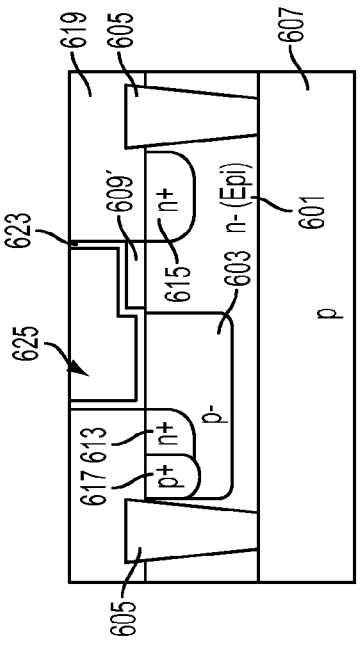
Figure 6E:
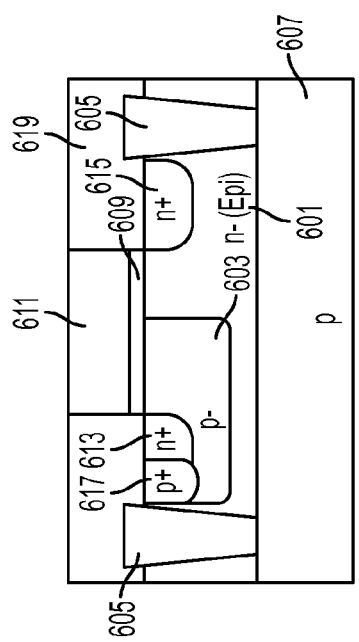

Dummy gate 611 is removed, for example by dry reactive ion etch (RIE), forming a cavity 621 over gate oxide 609, as illustrated in FIG. 6E. Then, as illustrated in FIG. 6F, the portion of gate oxide 609 over p-well 603 is removed, for example using a mask, leaving gate oxide 609' and cavity 621'. Alternatively, only part of the oxide over p-well 603 may be removed.

Figure 6G:
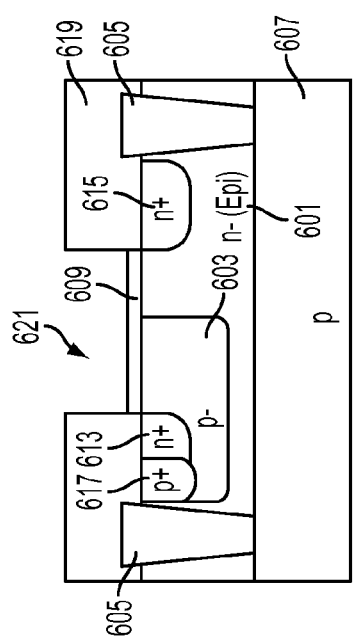

Adverting to FIG. 6G, a high-k dielectric 623, for example hafnium silicon oxynitride (HfSiON) or silicon dioxide ($SiO_2$)/HfSiON, is deposited in cavity 621'. The high-k could include an additional work function tuning layer, e.g., lanthanum oxide ($La_2O_3$). Alternatively, a thin oxide may be formed over p-well 603 prior to forming the high-k dielectric 623. Further, an additional oxide may be grown or deposited on gate oxide 609' for a thicker effective oxide thickness prior to depositing high-k dielectric 623. Then, a metal gate 625 is deposited in the remainder of cavity 621' followed by CMP. After CMP, back end of line (BEOL) processing may proceed.

FIGS. 7A through 7D schematically illustrate a process flow for forming an LDMOS having a tied metal gate on different gate dielectrics, in accordance with another exemplary embodiment, beginning with isolation and well formation as illustrated in FIG. 6A. Adverting to FIG. 7A, a first high-k dielectric layer is deposited on $p^-$ well 603 and a second high-k dielectric layer is deposited on $n^-$ region 601, adjacent the first high-k dielectric layer. The dielectric layers may be etched, leaving first high-k dielectric layer 701 on a portion of $p^-$ well 603 and second high-k dielectric layer 703 on a portion of $n^-$ Epi region 601. Alternatively, layers 701 and 703 may be formed only over the respective portions of $p^-$ well 603 and $n^-$ Epi region 601. Second high-k dielectric layer 703 may have a higher work function than first high-k dielectric layer 701. For example, dielectric layer 701 may be formed of HfSiON/$La_2O_3$, and dielectric layer 703 may be formed of HfSiON/titanium nitride (TiN)/aluminum (Al)/TiN. Alternatively, additional work function materials, such as—titanium (Ti)/nickel (Ni), may be deposited, etched, and annealed to impart a higher work function to dielectric layer 703. In addition, an oxide layer may be formed under each of the high-k dielectric layers.

Figure 7A:
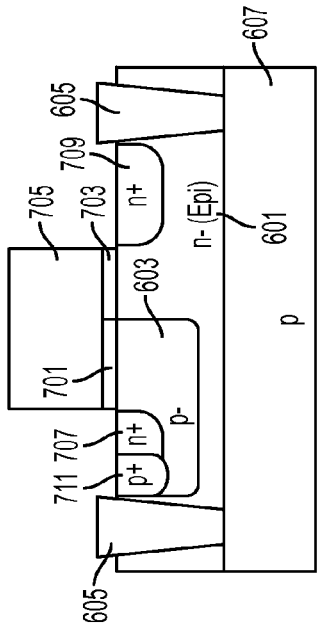
FIG. 7A through 7D schematically illustrate a process flow for forming an LDMOS having a tied metal gate on different gate dielectrics, in accordance with another exemplary embodiment.
Figure 7B:
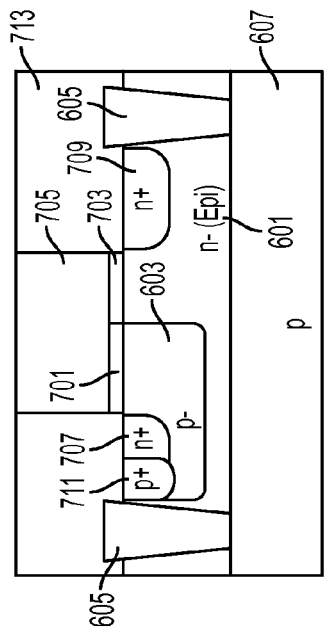

As illustrated in FIG. 7B, a common metal gate electrode 705 is formed on high-k dielectric layers 701 and 703. An a-Si gate may alternatively be included on metal gate 705.

Figure 7C:
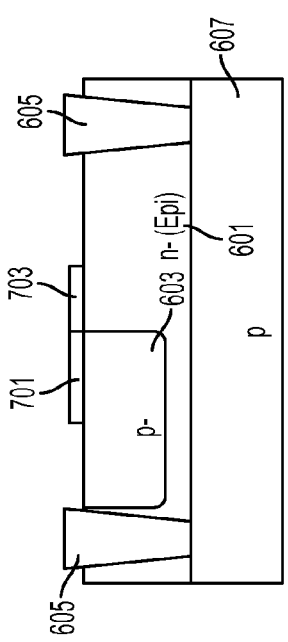

A lightly doped drain (LDD) may optionally be formed followed by spacer formation (not shown for illustrative convenience). Source 707 and drain 709 may then be formed, as well as p⁺ body 711, as illustrated in FIG. 7C. Rapid thermal anneal (RTA) and source/drain silicidation may be performed by conventional methods.

Figure 7D:
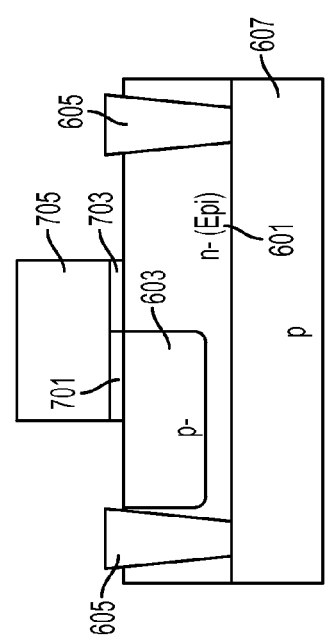

Adverting to FIG. 7D, an ILD 713, for example $SiO_2$, is formed over the entire substrate. CMP may be performed, if necessary, and BEOL processing may proceed.

Figure 8A:
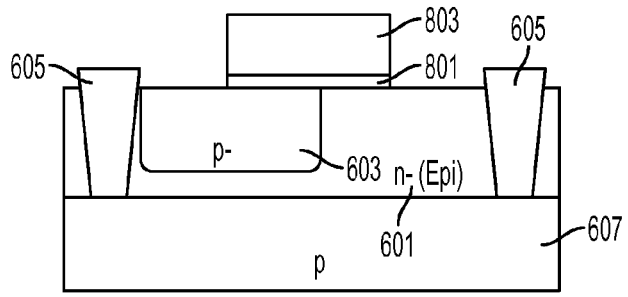
FIGS. 8A through 8F schematically illustrate a process flow for forming an LDMOS having a single metal gate on dual gate dielectrics, in accordance with another exemplary embodiment.

FIGS. 8A through 8F schematically illustrate a process flow for forming an LDMOS having a single metal gate on dual gate dielectrics, in accordance with another exemplary embodiment, beginning with isolation and well formation as illustrated in FIG. 6A. As illustrated in FIG. 8A, a dummy gate stack with dielectric layer 801 and gate electrode 803 is formed on a portion of p⁻ well 603 and a portion of n⁻ Epi region 601.

Figure 8B:
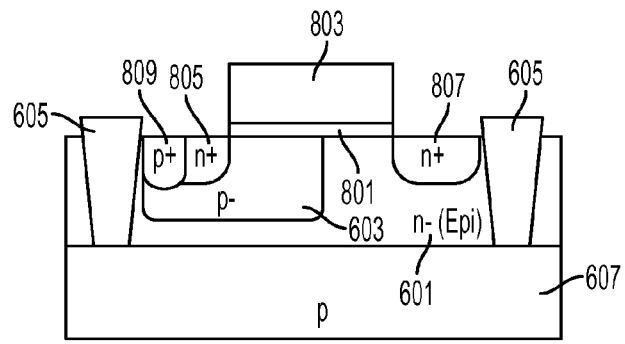

A lightly doped drain (LDD) may optionally be formed followed by spacer formation (not shown for illustrative convenience). Source 805 and drain 807 may then be formed, as well as p⁺ body 809, as illustrated in FIG. 8B. Rapid thermal anneal (RTA) and source/drain silicidation may be performed by conventional methods.

Figure 8C:
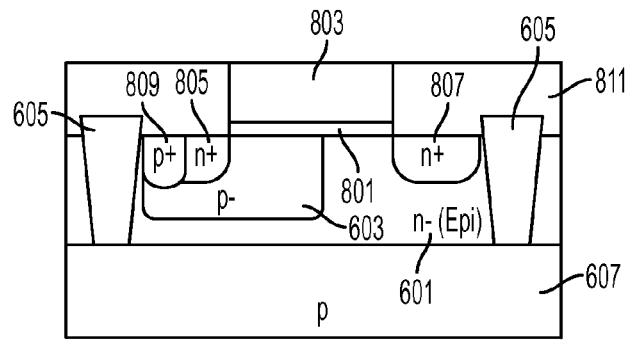
Figure 8D:
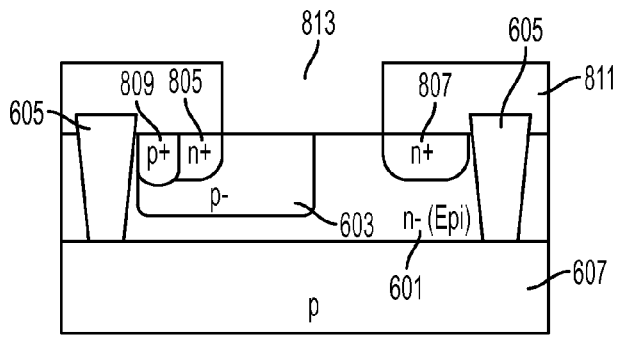

Adverting to FIG. 8C, an ILD 811, for example $SiO_2$, is formed over the entire substrate, including dummy gate electrode 803. CMP is performed to expose the top surface of dummy gate electrode 803. The dummy gate stack (gate dielectric 801 and gate electrode 803) is removed, for example by dry etch (RIE), forming a cavity 813 over on a portion of p⁻ well 603 and a portion of n⁻ Epi region 601, as illustrated in FIG. 8D.

Figure 8E:
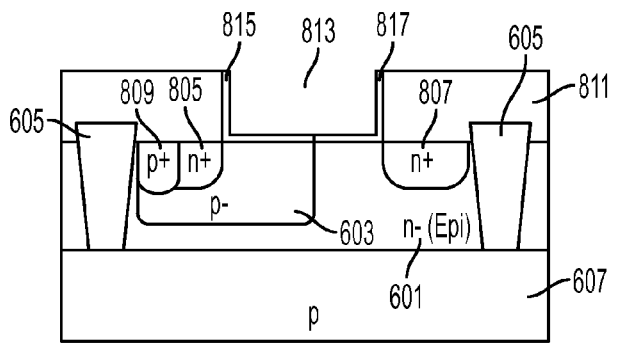

Then, as illustrated in FIG. 8E, a first high-k dielectric 815, for example HfSiON/$La_2O_3$, is deposited in the cavity over the portion of p⁻ well 603 and a second high-k dielectric 817, for example HfSiON/TiN/Al/TiN, is deposited in the cavity over the portion of n⁻ Epi region 601. Alternatively a single high-k dielectric, such as hafnium oxide ($HfO_2$), may be deposited in the cavity, and portions 815 and 817 may be differently doped, for example with an N⁺ for portion 815 and Al for portion 817, or additional work function adjustment materials, e.g., Ni, may be deposited and etched, to form first and second high-k dielectric layers 815 and 817 with different work functions. In addition, a common oxide layer may be deposited prior to the high-k dielectric layers.

Figure 8F:
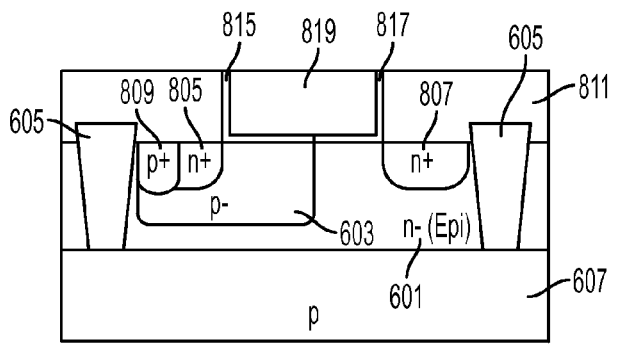

Adverting to FIG. 8F, a metal gate 819 is deposited in cavity 813 followed by CMP. After CMP, back end of line (BEOL) processing may proceed.

The embodiments of the present disclosure can achieve several technical effects, including channel control and a high breakdown voltage while maintaining a low parasitic resistance. The present disclosure enjoys industrial applicability in any technologies employing embedded high voltage transistors, such as automobiles, display electronics, telecommunications, and power converters.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming a first well and a second well in a substrate, the second well surrounding the first well;
   doping the first well with a first-type dopant and the second well with a second-type dopant;
   forming a source in the first well and a drain in the second well;
   forming a doped region of the first-type dopant in the first well, the doped region functioning as a body contact to the first well;
   forming a first gate stack comprising HfSiON/$La_2O_3$ on a portion of the first well;
   forming a second gate stack comprising HfSiON/TiN/Al/TiN on a portion of the second well;
   wherein the first and second gate stacks have a common gate electrode, and the second gate stack has a higher work function than the first gate stack.

2. The method according to claim 1, comprising forming the first and second gate stacks by:
   forming an oxide layer on the portion of the first well and on the portion of the second well;
   removing the oxide layer from the portion of the first well, leaving the oxide layer on the portion of the second well;
   forming a high-k dielectric layer on the oxide layer and on either the portion of the first well or on a second oxide layer thinner than the oxide layer over the portion of the first well; and
   forming a common metal gate electrode on the high-k dielectric layer.

3. The method according to claim 2, comprising forming the first and second gate stacks by:
   forming a dummy gate electrode on the oxide layer prior to removing the oxide layer from the portion of the first well;
   forming an interlayer dielectric over the entire substrate;
   removing the dummy gate electrode, forming a cavity;
   removing the oxide layer from the portion of the first well, leaving the oxide layer on the portion of the second well;
   forming the high-k dielectric layer on the portion of the first well and on the oxide layer; and
   forming the common metal gate electrode on the high-k dielectric layer.

4. The method according to claim 1, comprising forming the first and second gate stacks by:
   forming a first high-k dielectric layer or an oxide layer and a first high-k dielectric layer on the portion of the first well;
   forming a second high-k dielectric layer or an oxide layer and a second high-k dielectric layer on the portion of the second well; and
   forming a common gate electrode on both the first and second high-k dielectric layers.

5. The method according to claim 1, comprising forming the first and second gate stacks by:
   forming a dielectric layer on the portion of the first well and on the portion of the second well;
   implanting a first dopant in the dielectric layer on the portion of the first well; and
   implanting a second dopant, different from the first dopant, in the dielectric layer on the portion of the second well; and
   forming a common gate electrode on the dielectric layer.

6. The method according to claim 1, comprising forming the first and second gate stacks by:
   forming a dielectric layer on the portion of the first well and on the portion of the second well;
   depositing a work function adjustment material on the dielectric layer on the portion of the first well or the portion of the second well; and
   forming a common gate electrode on the dielectric layer.

7. The method according to claim 1, comprising forming the first and second gate stacks by:
   forming a dummy gate stack on the substrate over the portions of the first well and the second well;
   forming an interlayer dielectric (ILD) over the entire substrate;
   removing the dummy gate stack, forming a cavity;
   forming a first dielectric layer or an oxide layer and a first dielectric layer in the cavity on the portion of the first well;
   forming a second dielectric layer or an oxide layer and a second dielectric layer in the cavity on the portion of the second well; and
   forming a common metal gate electrode on the first and second dielectric layers.

8. The method according to claim 1, comprising forming the first and second gate stacks by:
   forming a dummy gate stack on the substrate over the portions of the first well and the second well;
   forming an interlayer dielectric (ILD) over the entire substrate;
   removing the dummy gate stack, forming a cavity;
   forming a dielectric layer in the cavity;
   implanting a first dopant in the dielectric layer on the portion of the first well;
   implanting a second dopant, different from the first dopant, in the dielectric layer on the portion of the second well; and
   forming a common metal gate on the dielectric layer.

9. The method according to claim 1, comprising forming the first and second gate stacks by:
   forming a dummy gate stack on the substrate over the portions of the first well and the second well;
   forming an interlayer dielectric (ILD) over the entire substrate;
   removing the dummy gate stack, forming a cavity;
   forming a dielectric layer or an oxide layer and a dielectric layer in the cavity;
   depositing a work function adjustment material on the dielectric layer on the portion of the first well or the portion of the second well; and
   forming a common metal gate on the dielectric layer and on the work function adjustment material.

10. A method comprising: forming a lateral diffused MOS (LDMOS) by:
   forming a first well and a second well in a substrate, the second well surrounding the first well;
   doping the first well with a p-type dopant and the second well with an n-type dopant;
   forming a source in the first well and a drain in the second well; and
   forming a p-doped region in the first well, the p-doped region functioning as a body contact to the first well;
   forming a first gate stack comprising $HfSiON/La_2O_3$ on the substrate over a portion of the first well;
   forming a second gate stack comprising HfSiON/TiN/Al/TiN on the substrate over a portion of the second well, the first and second gate stacks having a common gate electrode, and the second gate stack having a higher work function than the first gate stack, wherein the first and second gate stacks include different gate dielectric layers or asymmetrical dielectric layers.

11. The method according to claim 10, comprising forming different gate dielectric layers by different dielectric materials on the portions of the first and second wells, respectively, or by forming a common dielectric layer on the portions of the first and second wells and implanting different dopants in the dielectric layer on the portions of the first well and the second well, respectively.

12. The method according to claim 10, comprising forming asymmetrical dielectric layers by:
   forming an oxide layer on the portion of the first well and on the portion of the second well;
   removing the oxide layer from the portion of the first well, leaving the oxide layer on the portion of the second well; and
   forming a dielectric layer on the portion of the first well and on the oxide layer.

* * * * *